United States Patent Office 3,810,829
Patented May 14, 1974

3,810,829
SCANNING NOZZLE PLATING SYSTEM

James C. Fletcher, Administrator of the National Aeronautics and Space Administration, with respect to an invention of Gerald D. Oliver, Altadena, Calif.

Filed June 28, 1972, Ser. No. 266,913
Int. Cl. B01k *3/00;* B23p *1/00*
U.S. Cl. 204—222 9 Claims

ABSTRACT OF THE DISCLOSURE

A plating system is disclosed wherein a substrate to be plated is supported on a stationary platform. A nozzle assembly with a small nozzle is supplied with a plating solution under high pressure, so that a constant-flow stream of solution is directed to the substrate. The nozzle assembly is moved relative to the substrate at a selected rate and movement pattern. A potential difference (voltage) is provided between the substrate and the solution in the assembly. The voltage amplitude is modulated so that only when the amplitude is above a minimum known value plating takes place.

BACKGROUND OF THE INVENTION

(1) Field of the invention

The present invention generally relates to pattern plating, and more particularly, to a new arrangement for, and a method of, plating or etching patterns without masking.

(2) Description of the prior art

Over the years, many systems and methods were developed for plating patterns of metal on metal or other substrate as well as for etching such patterns in various substrate. With some of the more advanced techniques relatively fine-line pattern resolution is achievable. However, even with those techniques, the plating or etching process is quite involved, requiring several lengthy steps. These include masking of the substrate to produce the desired pattern, and in many methods tank dipping to produce the final plating or etching. The elimination of the masking requirement would contribute greatly to the advancement of the art since masking increases the complexity and cost of the process and is a contributing factor to limited pattern resolution. Tank dipping is also quite undesirable since the solution in the tank tends to become contaminated, thereby contaminating the substrate surface on which plating is to take place. Frequent replacement of the solution is expensive, particularly in large tanks. Solution filtering which is employed quite often, is only partially effective. However, its use increases system cost and maintenance requirements.

OBJECTS AND SUMMARY OF THE INVENTION

It is a primary object of the present invention to provide a new system for plating or etching metal on a substrate.

Another object of the invention is to provide a new plating or etching system with very fine-line pattern resolution and which does not require a masking process to produce the pattern.

Yet another object of the invention is to provide a new plating or etching system which does not require tank dipping and which is capable of producing patterns with very fine-line resolution.

A further object of the invention is to provide a new method of plating on, or etching in, a substrate a fine-line pattern without masking or tank dipping.

These and other objects of the invention are achieved by scanning a two dimensional original pattern to be plated or etched in a preselected scan pattern, e.g. along two orthogonal axes, controlled by scan control signals, to obtain pattern-defining signals. The scan control signals and the pattern-defining signals may be stored on an appropriate medium, e.g. magnetic tape for subsequent use during plating or etching at a rate lower than the scan rate of the original pattern. In accordance with the invention, the substrate is supported on a platform or table. A nozzle assembly, which contains a plating or etching solution and has a nozzle, is positioned adjacent to the substrate so that a constant-flow stream of plating solution is directed to the substrate at high pressure through the nozzle. A controller is supplied with the scan control signals and the pattern-defining signals. It uses the scan control signals to control the relative motion between the nozzle assembly and the substrate, and it uses the pattern-defining signals to modulate the amplitude of a voltage with which the stream is charged. As a result, a pattern, corresponding to the scanned original pattern, is plated on, or etched in, the substrate.

The plating thickness is determined by the stream current amplitude, i.e., the amperage, and the rate of movement of the nozzle assembly with respect to the table. As will be pointed out hereafter as the constant-flow stream of the solution strikes the substrate some droplets are separated from the stream. These droplets contain only surface charges which are not sufficient to produce plating. These droplets tend to clean the substrate surface, by washing it as they are driven off, thereby insuring the cleanliness of the surface on which plating is to take place. A stream of air is used to remove the formed droplets from the plated surface.

The novel features of the invention are set forth with particularity in the appended claims. The invention will best be understood from the following description when read in conjunction with the accompanying drawings.

DETAILED DESCRIPTION OF THE PREFERRED EMBODIMENTS

Figures 1, 2:
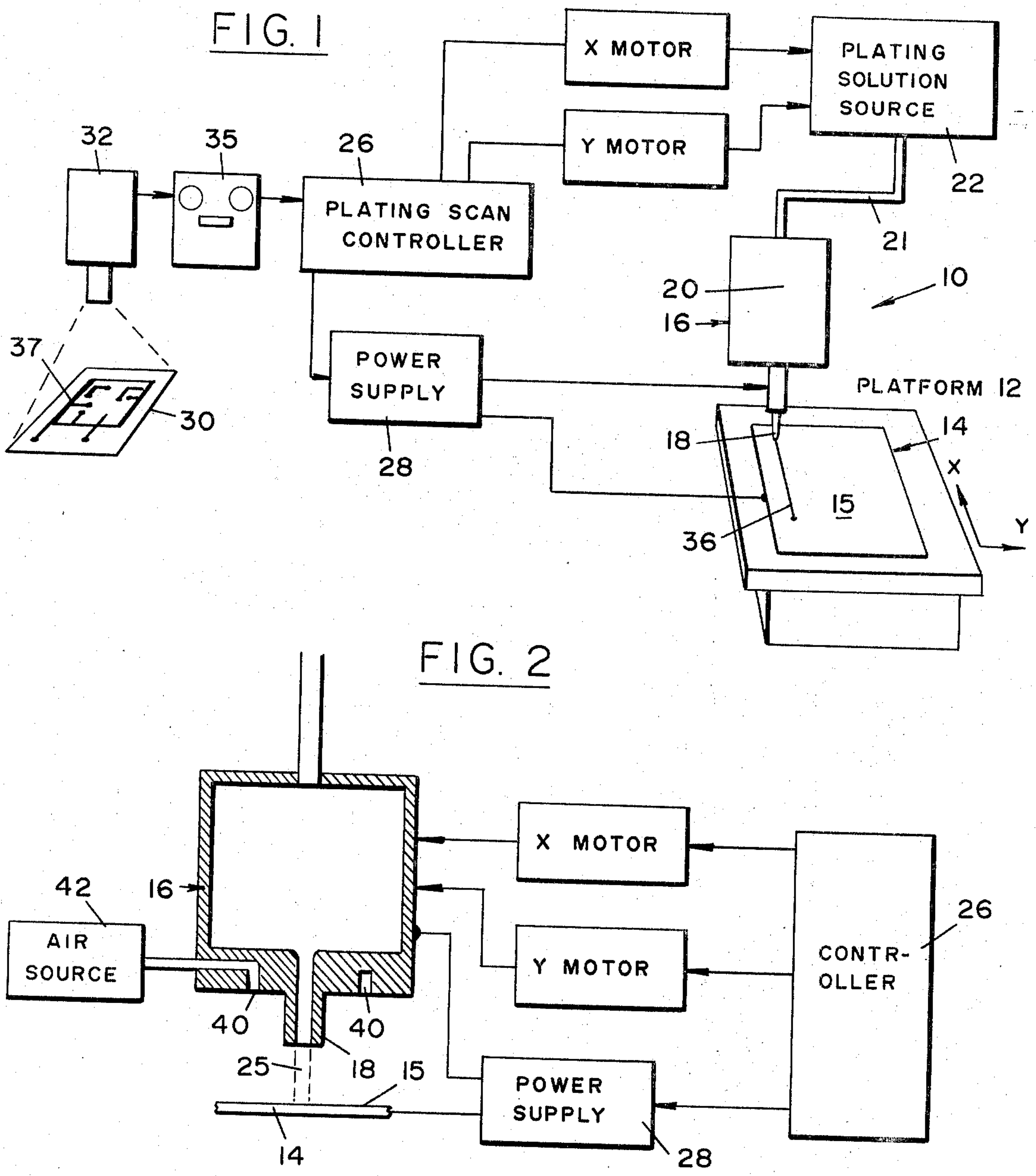
FIGS. 1 and 2 are diagrams useful in explaining the present invention.

The present invention will be described in conjunction with plating a pattern of copper on a nickel plate. However, as will be appreciated from the following description, the invention can be used to plate any metal or any other appropriate substrate or to etch such substrate. As shown in FIG. 1 in accordane with the present invention the system 10 includes a platform 12 which supports a substrate 14, e.g. a nickel plate having a top surface 15 which is exposed along orthogonal axes X and Y. Also included is a nozzle assembly 16 with a nozzle 18 which is positioned along an axis perpendicular to the XY plane. The nozzle assembly contains a plating solution 20, e.g., copper salt, which is received through a flexible line 21 from a stationary plating solution source 22 under high pressure, e.g. 500–700 p.s.i. As a result, a constant-flow stream of plating solution is directed from the nozzle 18 to the nickel plate 14. In FIG. 2, wherein the nozzle assembly is shown in cross-sectional view, the stream is designated by numeral 25.

In accordance with the present invention, with a preselected potential difference between the stream 25 and the plate 14 when the current is above a minimum amplitude, the stream is force charged rather than surface charged. As a result, when the stream (a solid, continuous column of solution) contacts the plate 14, plating takes place. However, when the current amplitude is below the minimum amplitude even though the stream contacts the plate 14, no plating takes place.

As shown in FIG. 2 the nozzle assembly 16 is connected to an X motor and to a Y motor, both of which are controlled by signals from a controller 26. The latter which is assumed to be supplied with the scan control signals and the pattern-defining signals also controls a power supply 28 which is connected to both the substrate 14 and the nozzle assembly 16. The function of the power supply 28 is to provide a modulated potential difference or voltage between the nickel substrate 14 and the copper containing plating solution 20 or stream 25.

As is appreciated, the copper ions in the solution must be charged sufficiently for plating to take place. Thus the voltage between the stream and the substrate must be above a minimum amplitude e.g. 5.8 volts for any meaningful plating to take place. In the present invention the controller 26 controls the power supply with the pattern-defining signals so that the voltage is above the minimum amplitude when plating is to occur. The scan control signals, supplied to the controller are used to control the nozzle assembly motion to traverse a motion or scan pattern corresponding to the scan patten of the original pattern.

Figure 3:
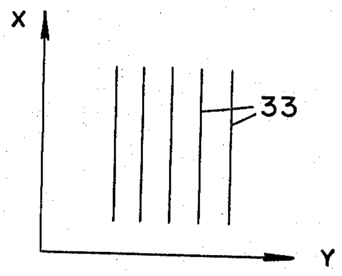
FIG. 3 is a diagram of a scan pattern of parallel lines.

Let it be assumed that the original pattern, designated in FIG. 1 by numeral 30, is scanned by scanner 32 in a series of scan lines which are parallel in the X axis and stepped or spaced in the Y axis, as shown in FIG. 3, wherein the lines are designated by numerals 33. Such a scan pattern is sometimes referred to as a TV scan raster. The scan control signals, corresponding thereto, are assumed to be stored in a recorder 35. The latter is also assumed to store the pattern-defining signals corresponding to the original pattern 30 which are received during each scan line of scanner 32.

The controller 26 in response to the signals corresponding to the scan raster controls motors X and Y to move the nozzle assembly 16 with respect to table 12 along a series of parallel lines corresponding to scan lines 33 (FIG. 3). During the motion along each line the pattern-defining signals, corresponding to the original pattern, received while the scanner scanned the original pattern along a corresponding line, are used by the controller to modulate the current amplitude supplied by power supply 28.

As the nozzle assembly moves along each line with respect to the substrate, the constant-flow stream of solution 25 (see FIG. 2) contacts the substrate 14. However, plating takes place only during those instances when the potential voltage above a minimum value, e.g. 5.8 volts. When the potential voltage is below 5.8 volts, even though the plating solution or stream 25 contacts the substrate, plating does not occur. In FIG. 1 the plated line 36 corresponds to line 37 of the original pattern 30. In practice, since the stream 25 is directed to the substrate at high pressure, the stream is a solid cylinder from the nozzle to the point of impact. However, some of the solution is separated from the stream in the form of droplets at the point of contact. These droplets contain only surface charges which are insufficient to cause plating of the droplets on the substrate. The non-plated solution as well as solution droplets tend to clean, by a washing-like motion, the surface 15 ahead of the points at which plating is to take place as they rebound off the surface. The nozzle assembly 16 is provided with one or more apertures 40 (see FIG. 2) through which streams of compressed air from a source 42 are directed to surface 15. The air streams drive the non-plated solution and the droplets off the surface 15 thereby washing the surface as they are driven off therefrom. The air streams are located so as to drive off the droplets and the non-plated solution without disturbing the stream 25.

From the foregoing it is thus seen that in the present invention the plated pattern is formed by means of a charged constant-flow stream of plating solution which continuously contacts the surface to be plated. The nozzle, producing the stream, is moved relatively to the substrate in a raster scan pattern. A pattern is plated corresponding to the scan pattern of the original pattern. The plated pattern is formed by modulating the amplitude of the voltage above and below a minimum value so that only during instances when the voltage amplitude is above said value plating occurs. The plating thickness is a function of the scan rate of the nozzle assembly and the amplitude of the current, defined by amperage/inch$^2$/second.

Alternately stated the plating thickness is a function of the number of ions that convert into metal per unit time—per unit area. Assuming that the stream pressure diameter and temperature are constant, the plating thickness can be varied by either changing the current amplitude or the scan rate.

The resolution of the plated pattern is a function of the nozzle's opening dimension in a direction perpendicular to the stream flow, and the distance from the nozzle to the substrate, and the pressure applied to the stream. By positioning the nozzle close to surface 15 the width of each plated line is effectively equal to the nozzle's opening dimension. Thus, by varying this dimension the pattern line resolution can be varied. With a nozzle opening in the micron range, a micron range line pattern resolution is achievable. The resolution is limited only by the state of the art of providing a nozzle with a minimal opening size. With the present invention line resolution of 100 microns or less is easily attainable.

Herebefore it was assumed that the nozzle assembly 16 is moved with respect to the platform 12. Though this arrangement is preferable since in most cases the nozzle assembly mass is less than that of the platform, if desired the assembly 16 can be held stationary and the platform moved with respect thereto. Also, although the invention has been described in connection with plating it is similarly applicable for etching, by substituting an appropriate etching solution for the plating solution. For etching the substrate is at a potential lower than that of the etching solution.

Herebefore it was assumed that the scan control signals used to control the scan pattern of the original pattern and the pattern-defining signals are first stored in recorder 35 for subsequent supply to the controller 26 for use during the plating operation. This arrangement is preferable since the scanning of the original can be done electronically at a much faster rate than the plating operation. However, if slow original-pattern scanning is employed the signal may be supplied directly to the controller by bypassing the recorder. It is appreciated that the scan rate of the nozzle assembly may be achieved by varying the speeds of the X and Y motors.

Since in accordance with the present invention plating or etching takes place by current and voltage amplitude modulation and by relative motion of the nozzle assembly with respect to the substrate, no masking or tank dipping is required. Pattern resolution is primarily a function of nozzle opening and the format of the scan raster. The invention can be employed in any application wherein plating or etching is required. It may find wide use in the printing business in which plates etched with the alphanumeric characters to be printed are required. At present in the computer peripheral equipment art, cathode ray tubes are used to display stored alphanumeric characters. Therein as the characters are read out, they are used to modulate the intensity of the deflected beam of the tube to produce the display. In accordance with the present invention the beam deflection signals may be employed to control the motion of the nozzle assembly and the read out characters may be used to modulate the current amplitude rather than beam intensity. Thus the present invention can be used to etch or plate characters from a computer memory or from any other source such as a peripheral equipment-type typewriter.

Although particular embodiments of the invention have been described and illustrated herein, it is recognized that modifications and variations may readily occur to those skilled in the art and consequently it is intended that the claims be interpreted to cover such modifications and equivalents.

What is claimed is:

1. A plating system comprising:
a platform for supporting a substrate to be plated;
a source of plating solution;
nozzle assembly means coupled to said source and including a nozzle for directing a constant-flow stream of plating solution to said substrate under a minimal preselected pressure;
motion control means for controlling the relative motion and its rate between said platform and said nozzle assembly means in a preselected pattern;
power means coupled to said platform and to said nozzle assembly means to provide a potential difference between said platform and the stream of plating solution at a variable voltage amplitude, whereby said plating solution is plated to said substrate only during periods when the voltage amplitude is above a predetermined minimum value; and
controller means responsive to a first set of signals for controlling said motion control means to control the relative motion of said platform to follow a predetermined scan pattern and responsive to a second set of signals defining a pattern to be plated for modulating said power means to vary the voltage amplitude with said second set of signals so that the pattern defined by said second set of signals is plated on said substate as said nozzle assembly means and said platform move with respect to one another in said scan pattern.

2. A plating system as described in claim 1 further including force means for removing from said substrate plating solution which is not plated on said substrate.

3. A plating system as described in claim 2 wherein said force means includes a source of compressed air for diverting a stream of air toward said substrate so as to drive off therefrom non-plated plating solutions.

4. A plating system as described in claim 1 wherein said pressure is at least several hundred pounds per square inch, the potential difference between said platform and said nozzle assembly means is in the range of 6.8 volts and the current amplitude for plating said solution onto said substrate is determined by scan rates, impingement area of the stream, and temperature of plating solution being used.

5. A plating system as described in claim 1 wherein said nozzle has an opening dimension in the micron range in line with said stream, with the width of the plating in a direction perpendicular to said motion direction being a function of the nozzle's opening dimension.

6. A plating system as described in claim 1 wherein the thickness of the plating above said substrate is a function of the rate of relative motion between said nozzle assembly means and said platform and the current amplitude above said minimum value.

7. An etching system comprising:
a platform for supporting a substrate to be etched;
a source of etching solution;
nozzle assembly means coupled to said source and including a nozzle for directing a constant-flow stream of etching solution to said substrate under a minimal preselected pressure;
motion control means for controlling the relative motion and its rate between said platform and said nozzle assembly means in a preselected pattern;
power means coupled to said platform and to said nozzle assembly means to provide a potential difference between said platform and the stream of solution at a variable voltage amplitude, whereby said etching solution etches said substrate only during periods when the voltage amplitude is above a predetermined minimum value; and
controller means responsive to a first set of signals for controlling said motion control means to control the relative motion of said platform to follow a predetermined scan pattern and responsive to a second set of signals defining a pattern to be etched for modulating said power means to vary the voltage amplitude with said second set of signals so that the pattern defined by said second set of signals is etched in said substrate as said nozzle assembly means and said platform move with respect to one another in said scan pattern.

8. An etching system as described in claim 7 further including force means for removing from said substrate etching solution which does not etch said substrate.

9. An etching system as described in claim 8 wherein said force means includes a source of compressed air for diverting a stream of air toward said substrate so as to drive off therefrom etching solution which did not etch said substrate.

References Cited

UNITED STATES PATENTS

| | | | |
|---|---|---|---|
| 1,416,929 | 5/1922 | Bailey | 204—224 R X |
| 3,468,785 | 9/1969 | Polichette | 204—224 R |
| 3,551,310 | 12/1970 | Inoue | 204—224 M |

JOHN H. MACK, Primary Examiner

D. R. VALENTINE, Assistant Examiner

U.S. Cl. X.R.

204—129.7, 223, 224 R, 228